United States Patent
Momoka

(10) Patent No.: US 9,130,335 B2
(45) Date of Patent: Sep. 8, 2015

(54) LIGHT BEAM EMISSION APPARATUS, OPTICAL SCANNING APPARATUS INCLUDING THE LIGHT BEAM EMISSION APPARATUS, AND IMAGE FORMING APPARATUS INCLUDING THE OPTICAL SCANNING APPARATUS

(75) Inventor: Toshiki Momoka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 432 days.

(21) Appl. No.: 13/526,793

(22) Filed: Jun. 19, 2012

(65) Prior Publication Data

US 2012/0327164 A1    Dec. 27, 2012

(30) Foreign Application Priority Data

Jun. 22, 2011    (JP) ................................ 2011-138598

(51) Int. Cl.
| | |
|---|---|
| *G02B 7/02* | (2006.01) |
| *H01S 5/022* | (2006.01) |
| *B41J 2/44* | (2006.01) |
| *B41J 2/47* | (2006.01) |
| *G03G 15/04* | (2006.01) |
| *G02B 26/12* | (2006.01) |
| *G03G 15/043* | (2006.01) |

(52) U.S. Cl.
CPC ............. *H01S 5/02268* (2013.01); *B41J 2/442* (2013.01); *B41J 2/473* (2013.01); *G02B 7/022* (2013.01); *G02B 26/123* (2013.01); *G03G 15/04036* (2013.01); *H01S 5/02252* (2013.01); *H01S 5/02288* (2013.01); *G03G 15/0435* (2013.01)

(58) Field of Classification Search
CPC . G02B 7/022; H01S 5/02252; H01S 5/02268; H01S 5/02288; B41J 2/442
USPC ......... 347/130, 137, 138, 152, 238, 245, 263; 362/362
See application file for complete search history.

(56) References Cited

U.S. PATENT DOCUMENTS

| | | | | |
|---|---|---|---|---|
| 6,092,728 A | * | 7/2000 | Li et al. .......................... | 235/454 |
| 2008/0117487 A1 | * | 5/2008 | Amada et al. .................. | 359/204 |

FOREIGN PATENT DOCUMENTS

JP           4139030 B2    8/2008

* cited by examiner

*Primary Examiner* — Justin Seo
*Assistant Examiner* — Kendrick Liu
(74) *Attorney, Agent, or Firm* — Canon USA Inc IP Division

(57) ABSTRACT

In a light beam emission apparatus, the height of an elastic member configured to fill a clearance between a laser element and a laser holder is longer than the distance from a start position of press fitting of the laser element to a surface of the laser holder with which the elastic member comes into contact.

5 Claims, 15 Drawing Sheets

INSERTION DIRECTION OF LASER EMISSION APPARATUS

PRESS-FITTING DIRECTION OF LASER ELEMENT

FALLING PATH OF SCRAPED CHIPS

PRESS-FITTING DIRECTION OF LASER ELEMENT

FALLING PATH OF SCRAPED CHIPS

LIGHT BEAM EMISSION APPARATUS, OPTICAL SCANNING APPARATUS INCLUDING THE LIGHT BEAM EMISSION APPARATUS, AND IMAGE FORMING APPARATUS INCLUDING THE OPTICAL SCANNING APPARATUS

BACKGROUND OF THE INVENTION

1. Field of the Invention

The present disclosure relates to a light beam emission apparatus, an optical scanning apparatus equipped with the light beam emission apparatus, and an image forming apparatus.

2. Description of the Related Art

In an electrophotographic image forming apparatus, such as a copying machine or a laser beam printer, an electrostatic latent image is formed on a photosensitive member by projecting a light beam from a light source to the photosensitive member, the latent image is developed by toner, a visible toner image is transferred to a recording material, and the transferred image is fixed to the recording material.

In such recent image forming apparatuses, a problem has arisen that dust particles invade the optical scanning apparatus, which includes the light beam emission apparatus, and the dust particles adhere to the optical components, such as a rotary polygonal mirror, lenses, or mirrors, thus obstructing reflection and transmission of the light beam, and reducing the image quality. With regard to this problem, Japanese Patent No. 4139030 discusses a configuration designed to improve the dust-proof performance of the optical scanning apparatus.

The optical scanning apparatus discussed in Japanese Patent No. 4139030 will be described in detail with reference to FIG. 11. A laser beam emission apparatus 900, which is mounted in the optical scanning apparatus, includes a laser element 901 (light source), a laser holder 902 configured to hold the laser element 901, a control drive circuit 903, a collimator lens 904, and an aperture 905. The laser element 901 is held by being fitted into a hole in the laser holder 902. The collimator lens 904 is fixed to a support member extending from the laser holder 902.

An elastic member 906 is arranged between the laser holder 902 and the aperture 905, and an elastic member 907 is arranged between the laser element 901 and the laser holder 902. With this configuration, dust particles are prevented from invading the laser beam emission apparatus 900.

However, the problem with the optical scanning apparatus discussed in Japanese Patent No. 4139030 is that when the laser element 901 is press-fitted into the laser holder 902, scraped chips of the laser holder 902, produced by abrasion with the laser element 901, adhere to the collimator lens 904. This problem will be described in detail with reference to FIGS. 12A, 12B, 12C, and 12D.

A case where the elastic member 907 is provided on the laser element side will be described. FIGS. 12A and 12B are sectional views of the laser beam emission apparatus 901, in which the elastic member 907 is provided or mounted on the side of the laser element 901. FIG. 12A illustrates a state before the start of press fitting of the laser element 901. FIG. 12B illustrates a state immediately after the start of press fitting of the laser element 901.

During assembling of a laser beam emission apparatus 900, conventionally, the laser holder 902 is fixed vertically, and then the laser element 901 is press-fitted into the laser holder 902 in the direction of gravitational force. The elastic member 907 is an annular-shaped member formed with such an external diameter slightly smaller than that of the laser element 901 as to prevent a foreign substance from being trapped inside when the laser element 901 is press-fitted into the laser holder 902. When the laser element 901 begins to be press-fitted into the laser holder 902, the inside wall of the laser holder 902 is scraped by the peripheral edge of the laser element 901, thus producing scraped chips. Just after the start of press-fitting of the laser element 901, because the elastic member 907 is not yet in contact with the laser holder 902, the scraped chips pass below the elastic member 907 and then adhere to a lens body tube 902a of the laser holder 902. When the collimator lens 904 is mounted to the laser beam emission apparatus 900 with the scraped chips adhering to the lens body tube 902a, during the assembling process or during a subsequent transport of the laser beam emission apparatus 900, the scraped chips adhering to the lens body tube 902a will come off and adhere to the collimator lens 904.

Another case where the elastic member 907 is provided on the laser holder side will now be described. FIGS. 12C and 12D are sectional views of the laser beam emission apparatus 900 when the elastic member 907 is provided or mounted on the side of the laser holder 902. FIG. 12C illustrates a state before the start of press-fitting of the laser element 901, and FIG. 12D illustrates a state just after the start of press-fitting of the laser element 901.

The elastic member 907 is an annular-shaped member formed to have such a height lower than the start position of press-fitting of the laser element 901 as to prevent a foreign substance from being trapped inside when the laser element is press-fitted into the laser holder 902. When the laser element 901 begins to be press-fitted into the laser holder 902, the inside wall of the laser holder 902 is scraped by the peripheral edge of the laser element 901, thus producing scraped chips. Just after the start of press-fitting of the laser element 901, because the elastic member 907 is not yet in contact with the laser holder 902, the scraped chips pass above the elastic member 907 and then adhere to a lens body tube 902a of the laser holder 902. When the collimator lens 904 is mounted to the laser beam emission apparatus 900 with the scraped chips adhering to the lens body tube 902a, during the assembling process or during a subsequent transport of the laser beam emission apparatus 900, the scraped chips adhering to the lens body tube 902a will come off and adhere to the collimator lens 904.

As described above, if the laser element, including the collimator lens with scraped chips adhering to it, is press-fitted into the laser holder, the light beam about to pass through the collimator lens 904 is obstructed, degrading the image quality.

When the laser beam emission apparatus having scraped chips adhering to it is mounted to the optical scanning apparatus, it is likely that the scraped chips are dispersed inside the optical apparatus by a flow of air caused by the rotation of a rotary polygonal mirror in the optical scanning apparatus, and the scraped chips adhere to the lenses and mirrors, reducing the image quality.

SUMMARY OF THE INVENTION

According to an aspect of the present invention, a light beam emission apparatus includes a light source configured to emit a light beam, a holding member including an abutting portion and a fitting portion in which the light source is fitted, and an elastic member configured to fill a clearance between the light source and the holding member by being elastically deformed when the elastic member contacts both the light source and the abutting portion in a state in which the light source is fitted into the fitting portion. The elastic member is elastically deformed by being compressed by the light source and the abutting portion when the light source is fitted into the fitting portion. A length of the elastic member before being elastically deformed in an insertion direction of the light source into the fitting portion is longer than a length from an insertion port of the fitting portion for the light source to the abutting portion, so that the fitting portion and a fitted portion of the light source come into contact with each other after the elastic member begins to be elastically deformed or simultaneously when the elastic member begins to be elastically deformed by contacting both the light source and the abutting portion.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles disclosed herein.

DESCRIPTION OF THE EMBODIMENTS

Various exemplary embodiments, features, and aspects will be described in detail below with reference to the drawings.

An optical scanning apparatus and an image forming apparatus according to a first exemplary embodiment are described below.

Figure 1:
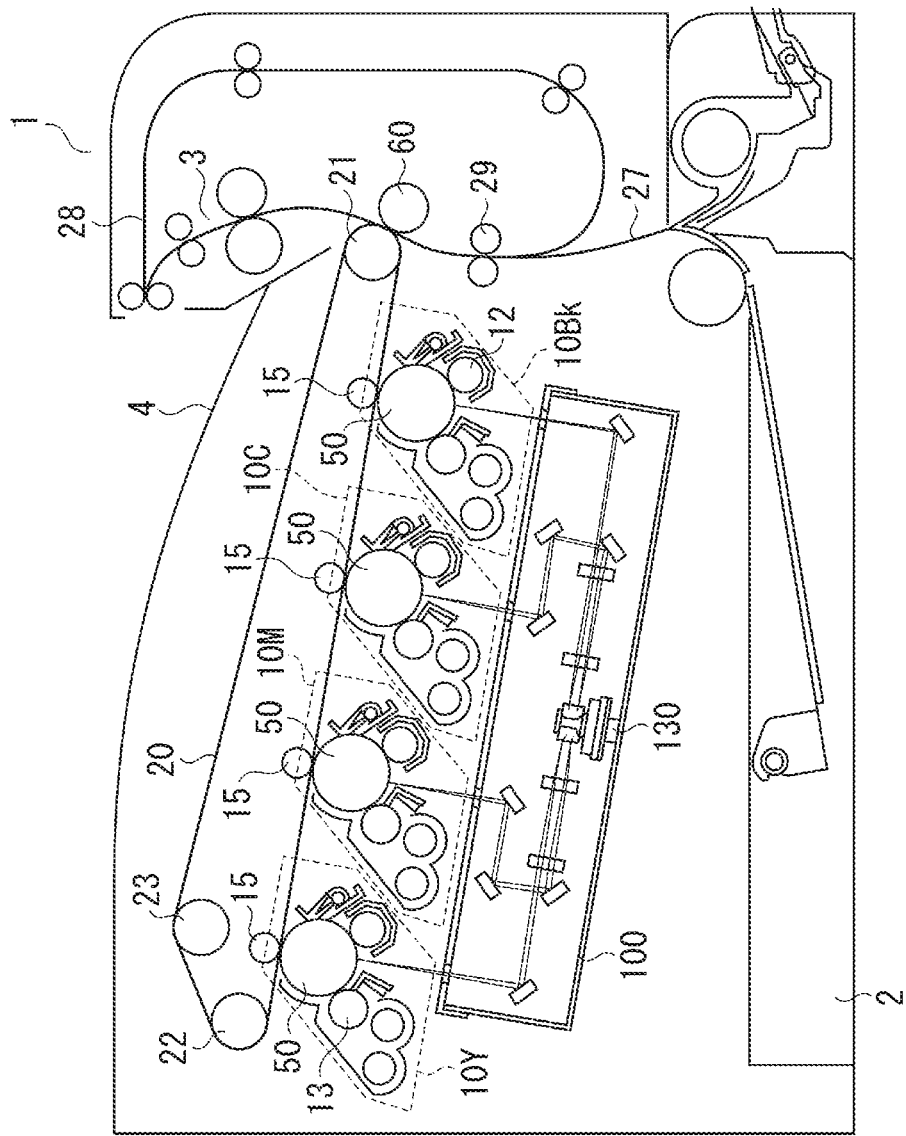
FIG. 1 is a schematic sectional view of an image forming apparatus according to a first exemplary embodiment.

FIG. 1 is a schematic configuration diagram illustrating a general configuration of a color laser beam printer (an image forming apparatus) of tandem type including a plurality of photosensitive drums. Embodiments not limited to providing a tandem type image forming apparatus but may be implemented as an image forming apparatus with a single photosensitive drum.

A laser beam printer in FIG. 1 includes four image forming engines 10Y, 10M, 10C, and 10Bk to form toner images of yellow, magenta, cyan, and black, and also includes an intermediate transfer belt, on which the toner images are transferred from the image forming engines. The toner images of different colors transferred to the intermediate transfer belt 20 are secondarily transferred to a recording sheet P. In this manner, a full color image is formed on the recording sheet P (a recording material).

The above-mentioned intermediate transfer belt 20 is an endless belt extending around belt conveyance rollers 21, 22, 23. The intermediate transfer belt 20, while rotating in the counterclockwise direction, receives a primary transfer of toner images formed by the different color image forming engines 10Y, 10M, 10C, and 10Bk. A secondary transfer roller 60 is provided in a position opposite the belt conveyance roller 21 across the intermediate transfer belt 20. The recording sheet P is passed between the secondary transfer roller 60 and the intermediate transfer belt 20, the roller 60 and the belt 20 being in contact under pressure with each other. Thus, the toner images are secondarily transferred from the intermediate transfer belt 20 to the recording sheet P.

Below the intermediate transfer belt 20, the four image forming engines 10Y, 10M, 10C, and 10Bk described above are arranged in parallel to each other, and each execute a primary transfer of a toner image formed according to image information about each color onto the intermediate transfer belt 20. The four image forming engines 10Y, 10M, 10C, and 10Bk are disposed in the order of yellow, magenta, cyan, and black along the rotational direction of the intermediate transfer belt 20.

Below the image forming engines 10Y, 10M, 10C, and 10Bk, an optical scanning apparatus 100 is disposed, which exposes a photosensitive drum 50 in each image forming engine according to the image information. The optical scanning apparatus 100 is shared by all of the image forming engines 10Y, 10M, 10C, and 10Bk. The optical scanning apparatus 100 includes four semiconductor lasers (not illustrated), each producing a laser beam (light beam) modulated according to image information for each color. Laser beams emitted from the four semiconductor lasers are deflected by a polygonal mirror (a rotary polygonal mirror) so that the laser beams move in the predetermined directions on the corresponding photosensitive drums. A detailed configuration of the optical scanning apparatus 100 will be described below.

Each laser beam deflected by the polygonal mirror 102 travels while being guided by optical members, such as lenses and mirrors, mounted in the optical scanning apparatus 100. After traveling along a predetermined path, the laser beams exit illumination ports provided at the upper side of the optical scanning apparatus 100 and expose the photosensitive drums 50 of the image forming engines 10Y, 10M, 10C, and 10Bk.

The image forming engines 10Y, 10M, 10C, and 10Bk each include a photosensitive drum 50, a charging roller 12 configured to charge the photosensitive drum 50 to a uniform background-area potential, and a development device 13 configured to develop an electrostatic latent image on the photosensitive drum 50 by exposure to the laser beam to thereby form a toner image on the photosensitive drum 50 according to image information for each color.

Primary transfer rollers 15Y, 15M, 15C, and 15Bk are disposed in positions opposite the photosensitive drums 50 of the image forming engines 10Y, 10M, 10C, and 10Bk across the intermediate transfer belt 20. Because a predetermined transfer bias voltage is applied to the primary transfer rollers 15Y, 15M, 15C, and 15Bk, an electric field is formed between the photosensitive drums 50 and the primary transfer rollers 15Y, 15M, 15C, and 15Bk, and electrically-charged toner images are transferred from the photosensitive drums 50 to the intermediate transfer belt 20 due to a coulomb force.

On the other hand, a recording sheet P is supplied to the inside of the printer from a sheet cassette 2 stored in a lower portion of the printer housing 1. More specifically, the recording sheet P is supplied to a secondary transfer position at which the intermediate transfer belt 20 and the secondary transfer roller 60 are in contact with each other. A conveyance path 27 for the recording sheet P inside the printer is provided in an almost vertical direction along the right-side face of the printer housing 1. The recording sheet P, which is drawn from the sheet cassette 2 located at the bottom of the printer housing 1, moves upward on the sheet conveyance path 27 and is conveyed to a registration roller 29, which controls timing for the recording sheet P to enter the secondary transfer position. After having the toner image transferred at the secondary transfer position, the recording sheet P is conveyed to a fixing device 3, which is provided right above the secondary transfer position. The recording sheet P with the toner image fixed by the fixing device 3 passes through discharge rollers 28 and is then ejected onto a discharge tray 4, which is mounted on a top portion of the printer housing 1.

Figure 2A:
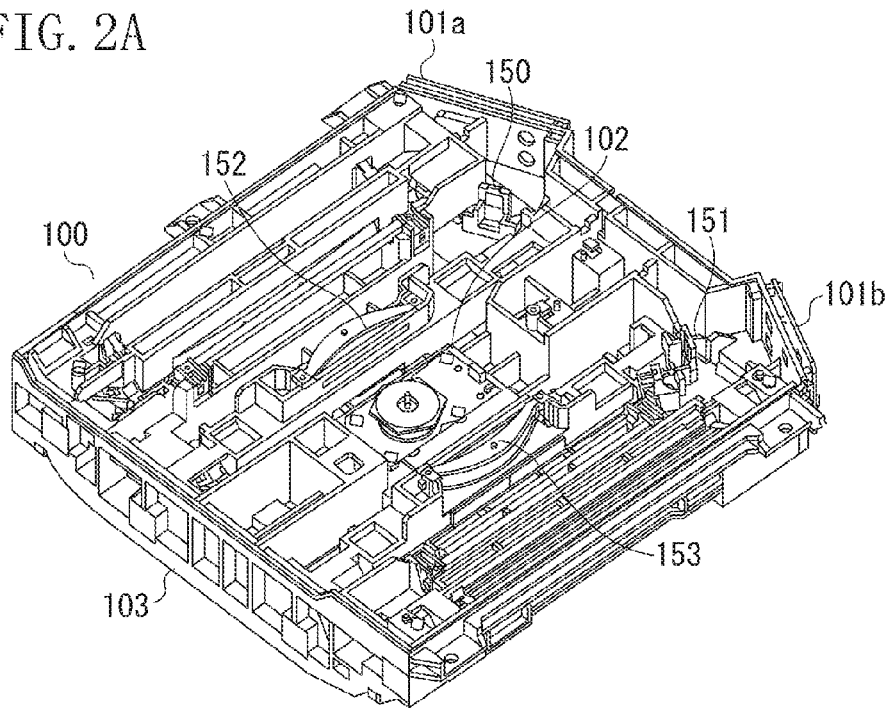
FIGS. 2A and 2B are perspective views of the image forming apparatus according to the first exemplary embodiment.
Figure 2B:
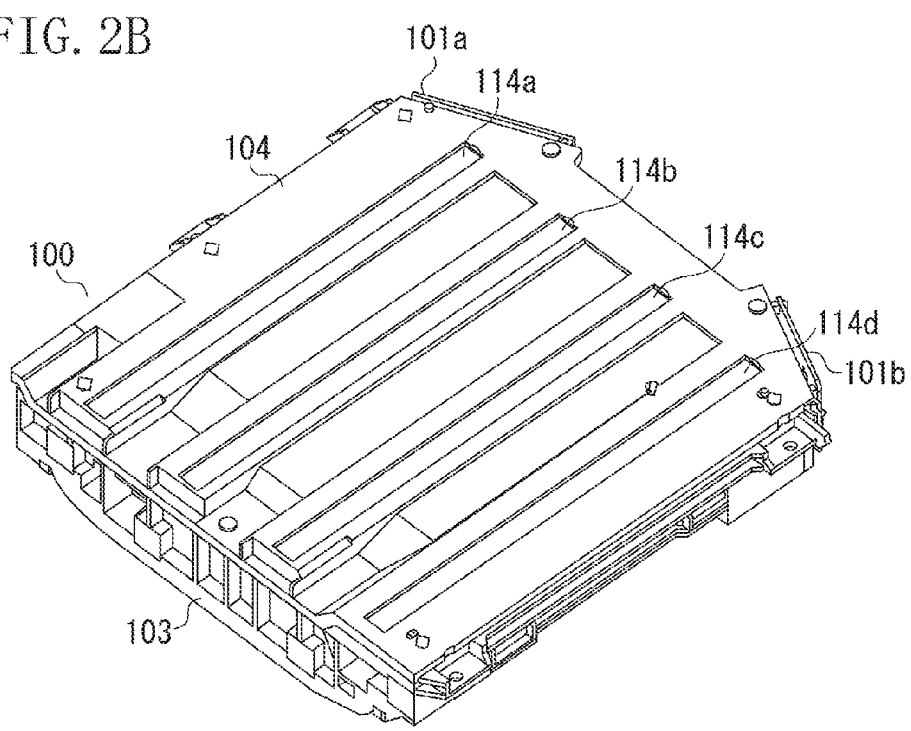
Figure 3:
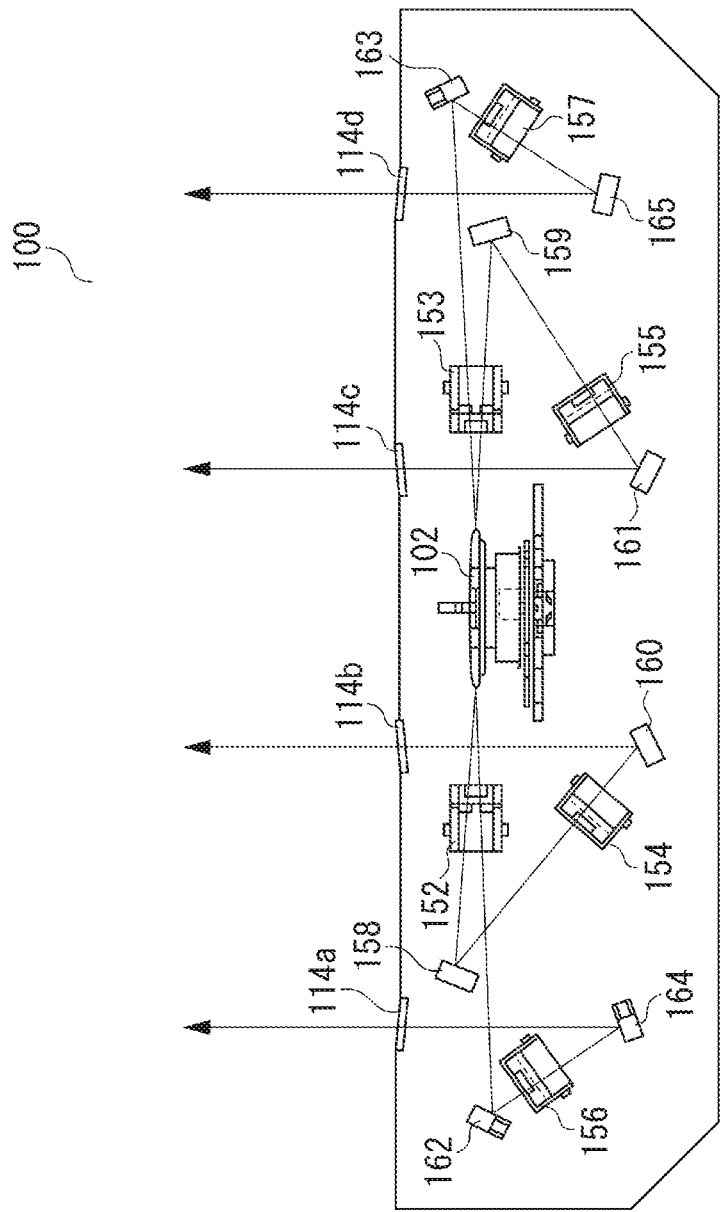
FIG. 3 is a sectional view of an optical scanning apparatus.

Referring to FIGS. 2A, 2B, and 3, an exemplary embodiment of an optical scanning apparatus for use in the image forming apparatus in FIG. 1 will be described.

FIGS. 2A and 2B are perspective views of the optical canning apparatus 100. FIG. 2A is a perspective view illustrating the inside of the optical scanning apparatus 100. FIG. 2B is a perspective view of the optical scanning apparatus 100 with the cover put on. As illustrated in FIG. 2A, the optical scanning apparatus 100 includes laser beam emission apparatuses 101a and 101b each configured to emit a laser beam, a polygonal mirror configured to reflect and deflect the laser beam, and a scanning unit 102 with a drive motor to rotate the polygonal mirror. The optical scanning apparatus 100 includes optical lenses 150 to 157 configured to focus a laser beam on the photosensitive drums 50 and mirrors 158 to 165 configured to guide the laser beam onto the photosensitive drums. As illustrated in FIG. 2B, the optical scanning apparatus 100 includes a housing 103 configured to fix and hold those optical elements. The housing 103 is fitted with a cover 104 to insulate the optical elements mounted in the housing 103 from external influences (dust-proof construction). The cover 104 is provided with laser transmission openings configured to enable a laser beam deflected by the polygonal mirror to be transmitted to the outside of the housing 103 and transparent dust-proof glass plates 114a, 114b, 114c, and 114d configured to tightly cover those openings.

FIG. 3 is a sectional view of the optical scanning apparatus 100. After being deflected by the polygonal mirror 102, a laser beam corresponding to the image forming engine 10Y passes through the optical lens 152 and is then reflected by the mirror 162 toward the optical lens 156. The laser beam reflected by the mirror 162 passes through the optical lens 156 and is then reflected by the mirror 164. The laser beam then passes through a dust-proof glass 105a to form an image on the photosensitive drum 50 of the image forming engine 10Y.

After being deflected by the polygonal mirror 102, a laser beam corresponding to the image forming engine 10M passes through the optical lens 152 and is then reflected by the mirror 158 toward the optical lens 154. The laser beam reflected by the mirror 158 passes through the optical lens 154 and is then reflected by the mirror 160. The laser beam then passes through the dust-proof glass 105b to form an image on the photosensitive drum 50 of the image forming engine 10M.

After being deflected by the polygonal mirror 102, a laser beam corresponding to the image forming engine 10M passes through the optical lens 153 and is then reflected by the mirror 159 toward the optical lens 155. The laser beam reflected by the mirror 159 passes through the optical lens 155 and then is reflected by the mirror 161. The laser beam then passes through the dust-proof glass 105c to form an image on the photosensitive drum 50 of the image forming engine 10C.

After being deflected by the polygonal mirror 102, a laser beam corresponding to the image forming engine 10Bk passes through the optical lens 153 and is then reflected by the mirror 163 toward the optical lens 157. The laser beam reflected by the mirror 163 passes through the optical lens 157 and is then reflected by the mirror 165. The laser beam then passes through the dust-proof glass 105d to form an image on the photosensitive drum 50 of the image forming engine 10Bk.

Figure 4A:
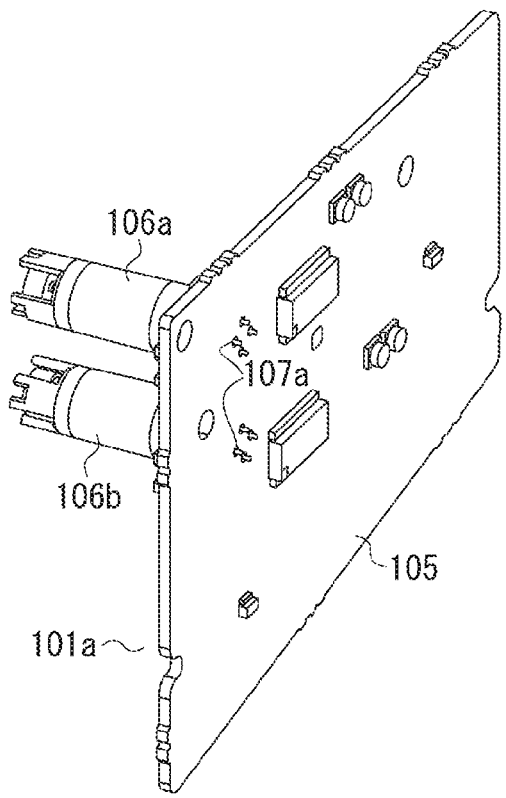
FIGS. 4A and 4B are perspective views of a laser beam emission apparatus mounted in the optical scanning apparatus.
Figure 4B:
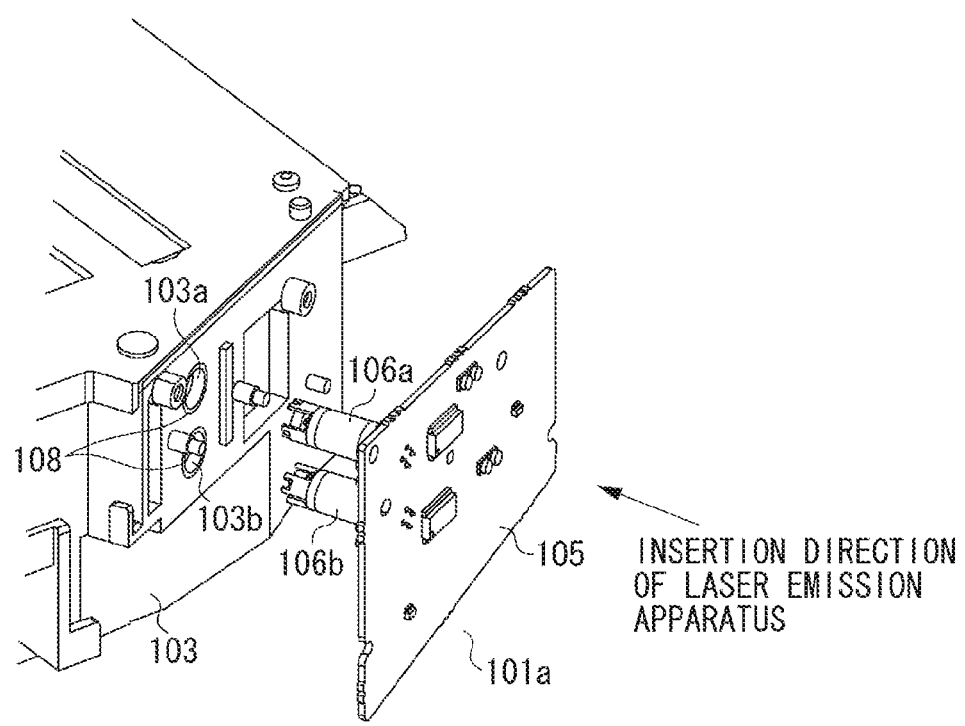

Referring to FIGS. 4A and 4B, a configuration of the laser beam emission apparatus 101a (light beam emission apparatus) configured to emit a laser beam will be described. Since laser beam emission apparatuses 101a and 101b are similar in configuration, a description of the laser beam emission apparatus 101b is omitted. FIG. 4A is a perspective view of the laser beam emission apparatus 101a. The laser beam emission apparatus 101a includes a laser substrate 105, and LD units 106a and 106b as light source holding devices. The LD unit 106a emits a laser beam to irradiate the photosensitive drum of the image forming engine 10Bk, and the LD unit 106b emits a laser beam to irradiate the photosensitive drum of the image forming engine 10C.

Figure 5A:
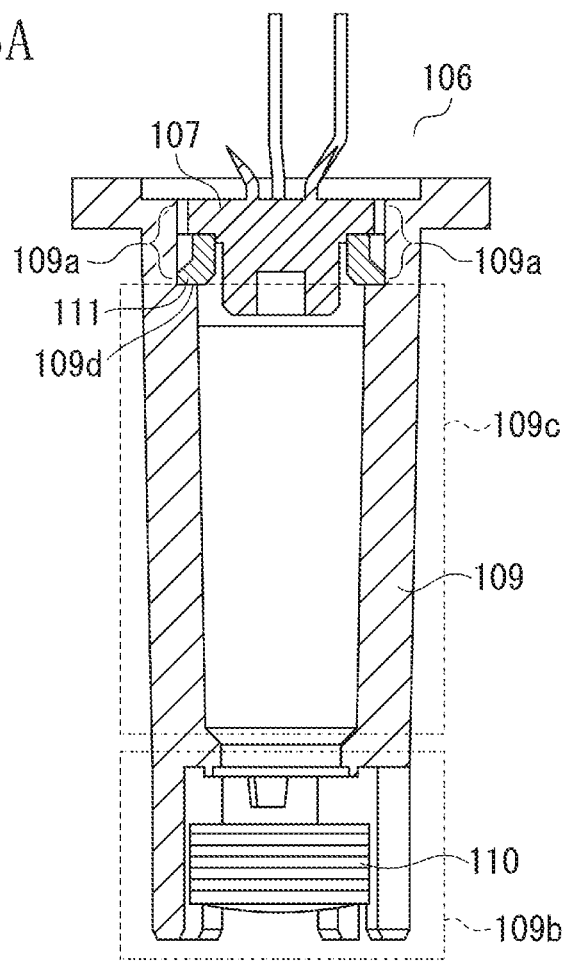
FIGS. 5A and 5B are schematic sectional views of a laser diode (LD) unit mounted in the laser beam emission apparatus according to the first exemplary embodiment.
Figure 5B:
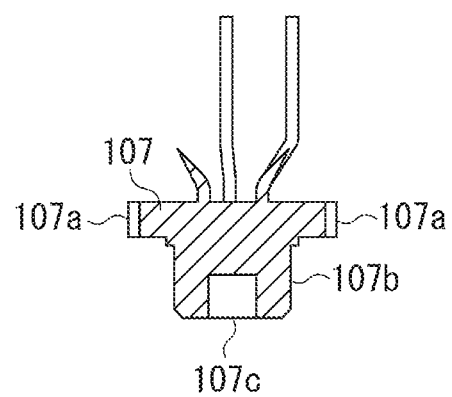

FIGS. 5A and 5B are sectional views, on an enlarged scale, of the LD unit 106a or 106b. The LD units 106a and 106b each have a laser element (light source). The LD units 106a and 106b are fixed to the laser substrate 105 by soldering lead pins 107a to the laser substrate 105.

Referring to FIG. 4B, how the laser beam emission apparatus 101a is mounted to the housing 103 will be described. FIG. 4B is a perspective view of the laser beam emission apparatus 101a and the housing 103. Close-fit bores 103a and 103b are formed in the housing 103. The LD units 106a and 106b are fitted into the close-fit bores 103a and 103b, and under this condition, the laser beam emission apparatus 101a is fastened to the housing 103 by screwing the laser substrate 105 to the housing 103. Since a minute clearance between the LD units 106a and 106b and the housing 103 is blocked (filled) by an elastic member 111 (a dust-proof material) made of rubber, for example, which contacts both the LD units 106a and 106b and the housing 103, there is no possibility for foreign substances to enter the inside of the housing 103.

Referring to FIGS. 5A and 5B, the LD unit 106a according to the first exemplary embodiment will be described in detail as follows. Since the LD units 106a and 106b are similar in construction, a description of the LD unit 106b is omitted. The LD unit 106a will be described as an LD unit 106.

FIG. 5A is a schematic sectional view of the laser element 107 (light source) fitted into the LD unit 106. FIG. 5B is an external side view of the laser element 107. As illustrated in FIG. 5A, the LD unit 106 includes a laser element 107 (light source), an LD holder 109 (shaded area) configured to hold the laser element 107, a collimator lens 110, and an elastic member 111 (a dust-proof material). The LD holder 109 has a fitted portion 109a formed to which the laser element 107 is fitted. The inside diameter of the fitted portion 109a is so designed as to be equal to or less than the outside diameter of the fitted portion 107a (FIG. 5A). The laser element 107 is fixed to the LD holder 109 by press-fitting the laser element 107 into the fitting portion 109a.

The fitting portion 109a and the fitted portion 107a of the laser element 107 are circular in shape. As illustrated in FIG. 5B, the laser element 107 has a non-fitting portion 107b, which is free of contact with the fitting portion 109a. The outside diameter of the non-fitting portion 107b of the laser element 107 is smaller than the fitted portion 107a, and the non-fitting portion 107b has a light emitting point 107c. The light emitting point emits a laser beam toward the collimator lens 110. When the laser element 107 is inserted into the fitting portion 109a to cause the laser element 107 to be fitted on the fitting portion 109a of the LD holder 109, the non-fitting portion 107b gets into the fitting portion 109a before the fitted portion 107a does.

The laser element 107 is fixed to the LD unit 109 when the laser element 107 is press-fitted into the fitting portion 19a, and the collimator lens 110 is fixed to the LD unit 109 when the collimator lens 110 is glued to the lens holding portion 109b. The gluing of the collimator lens 110 is performed after the laser element 107 has been press-fitted. The collimator lens 110 converts divergent incoming light into parallel light. The fitting portion 109a is connected to the lens holding portion 109b through the intermediary of the lens body tube 109c. The inside diameter of the lens body tube 109c is circular in cross section.

Figure 6A:
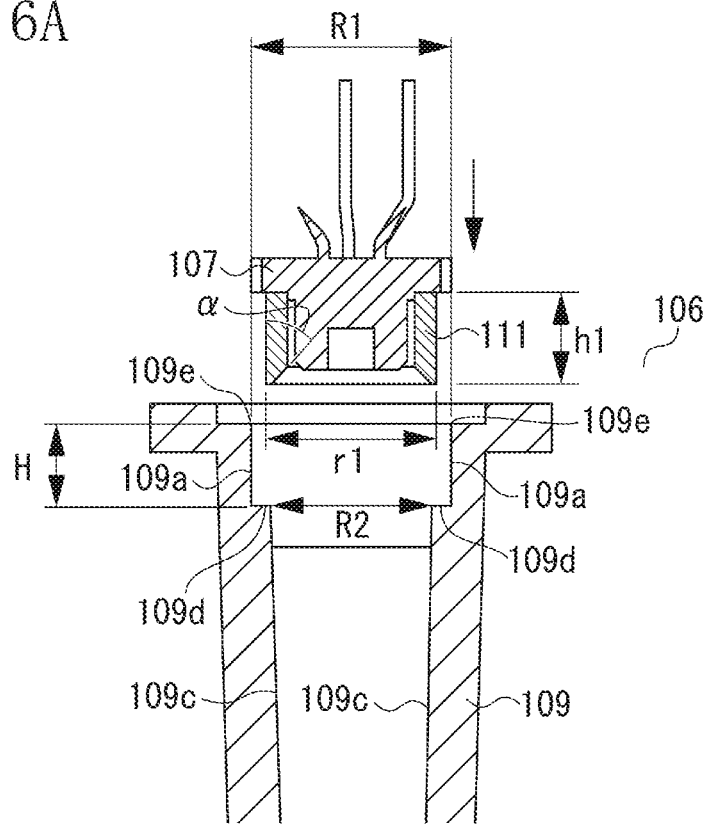
FIGS. 6A, 6B, 6C, and 6D are schematic sectional views illustrating a mounting procedure of the LD unit according to the first exemplary embodiment.
Figure 6B:
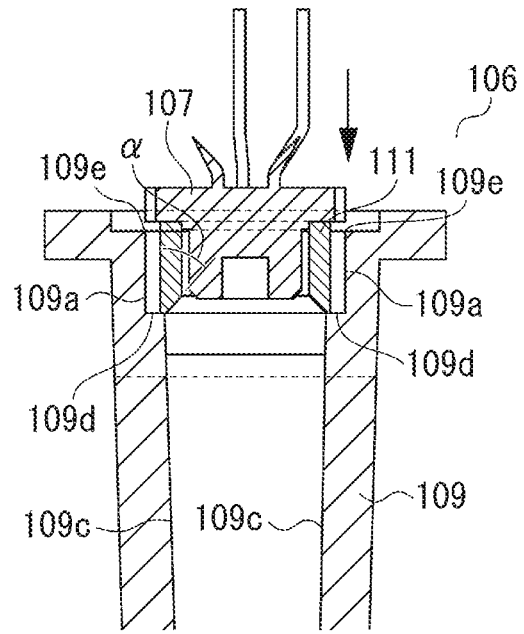
Figure 6C:
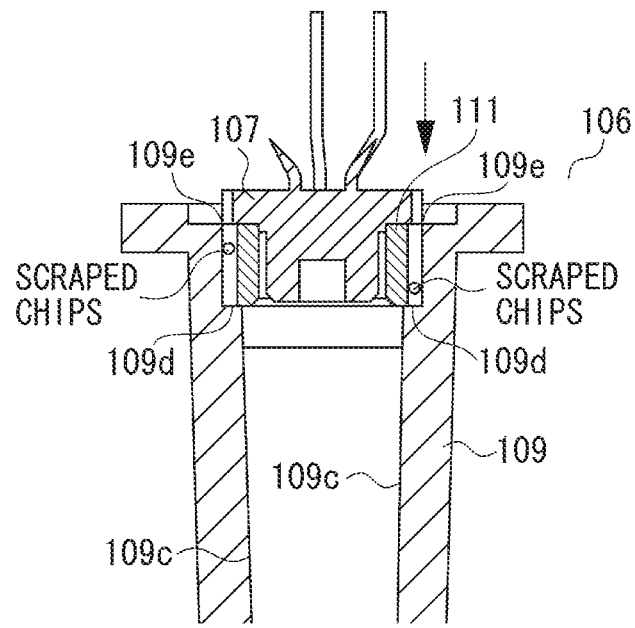
Figure 6D:
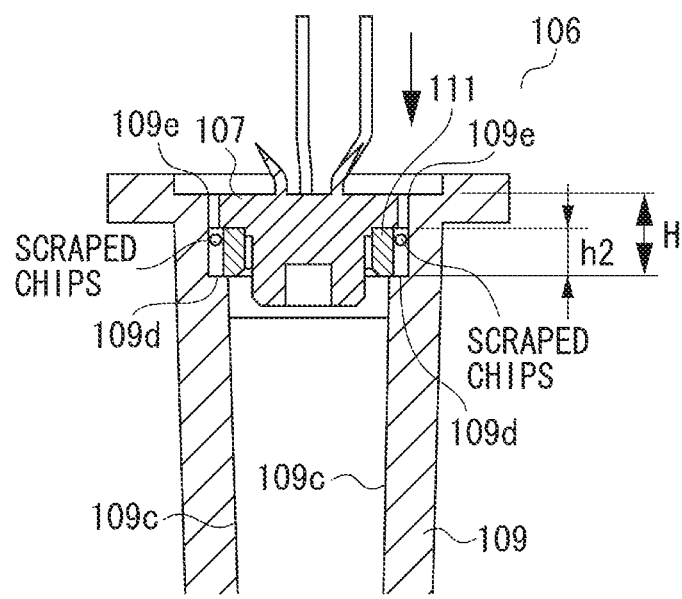

FIGS. 6A, 6B, 6C, and 6D are diagrams illustrating how the laser element 107 is press-fitted into the LD holder 109. FIGS. 6A and 6B illustrate states before the laser element 107 is press-fitted into the fitting portion 109a, FIG. 6C illustrates the state at the moment press-fitting of the laser element 107 into the fitting portion 109a is started, and FIG. 6D illustrates the state after press-fitting work has been completed.

As illustrated in FIG. 6A, the inside diameter R2 in the boundary area between the fitting portion 109a and the lens body tube 109c is smaller than the inside diameter R1 of the fitting portion 109a. Because the inside diameter in the boundary area between the fitting portion 109a and the lens body tube 109c is less than the inside diameter of the fitting portion 109a, this difference in the inside diameter gives rise to a flat portion 109d (an abutting portion or a contact portion) on which the elastic member abuts.

When the laser element is press-fitted (inserted) in the arrow direction, the elastic member 111 abuts on the flat portion 109d of the LD holder 109. When the laser element 107 is further press-fitted in the arrow direction, the elastic member is gradually compressed by the LD holder 109 and the laser element 107 and is thus elastically deformed.

There are two problems to be solved. First, the laser beam may be blocked by scraped chips adhering to the optical members because the scraped chips are likely to be produced by the abrasion that occurs when the laser element 107 is press-fitted into the fitting portion 109a. The other problem is as follows. It is required in design that the inside diameter of the fitting portion 109a and the outside diameter of the fitted portion of the laser element 107 should be approximately close to equal. However, due to component tolerance, there is some clearance between the LD holder 109 and the laser element 107. Consequently, there is a possibility that dust intrudes the clearance and adheres to the optical members.

Those two problems can be solved with the elastic member 111 configured as described below.

When the laser element 107 is mounted in the LD holder 109, the elastic member 111 is attached to the laser element 107. Under this condition, the laser element 107 is press-fitted into the LD holder 109. The elastic member 111 is an annular member, whose height h1 (the length in the insertion direction of the laser element 107) is equal to or longer than a distance H (h1≥H) from the flat portion 109d to the press-fitting start position 109e (at the entrance or the insertion opening of the fitting portion 109a) of the laser element 107). The outside diameter r1 of the elastic member 111 is smaller than the inside diameter R1 of the fitting portion 109a (r1<R1).

If a dimensional relation of h1>H holds, when the laser element 107 is inserted into the fitting portion 109a of the LD holder 109, the elastic member 111 comes into contact with the flat portion 109d before the laser element 107 contacts the entrance of the fitting portion 109a. Since the laser element 107 is further inserted in the arrow direction, as the elastic member 111 is gradually compressed by the flat portion 109d and the laser element 107, the elastic member 111 is elastically deformed. When the laser element 107 contacts the entrance of the fitting portion 109a, the clearance between the fitting portion 109a and the laser element 107 is blocked by the elastic member 111. The elastic member 111 is in the form of an annular ring extending around a circular structure of the fitting portion 109a and the laser element 107 and, therefore, in endless contact with both the fitting portion 109a and the laser element 107. Consequently, the elastic member 111 blocks (fills) the clearance around the whole circumference of both the fitting portion 109a and the laser element 107.

If a dimensional relation of h1=H holds, when the laser element 107 is inserted into the fitting portion 109a of the LD holder 109, the laser element 107 comes into contact with the entrance of the fitting portion 109a, and the elastic member 111 comes into contact with the flat portion 109d at the same time. Under this condition, the clearance between the fitting portion 109a and the laser element 107 is blocked by the elastic member 111.

FIG. 6B is a sectional view of the LD unit 106 in a state in which the leading end of the elastic member 111 is in contact with the LD holder 109 and the laser element 107 is not in contact with the entrance of the fitting portion 109a of the LD holder 109. The inner wall of the elastic member 111 has a diminishing conical taper from top to bottom. As illustrated in FIG. 6A, the leading end of the elastic member 111 is formed with an acute-angle (leading-end angle α) in cross section. With regard to a sectional view of the elastic member 111, the wall thickness of the leading end of the elastic member 111 becomes thinner toward the fitted portion (the portion fitted to the fitting portion 109a) of the laser element 107. For this reason, the closer the part of the elastic member 111 is to the leading end, the more easily elastic deformation occurs. Because the leading end of the elastic member 111 is processed to have an acute angle in cross section as illustrated in FIG. 6A, when the laser element 107 is press-fitted into the fitting portion 109a, the leading end of the elastic member 111 is deformed to bend toward the fitting portion 109a of the laser element 107, thereby reducing chances of the elastic member 111 entering the lens body tube 109a.

The diameter r1 of the leading end that contacts the flat portion 109d (referred to as the outside diameter of the elastic member) is set to be larger than the inside diameter R2 of the entrance of the lens body tube 109c. Therefore, the elastic member 111 bends outwards, which will be described below, without getting into the lens body tube 109c. Since the relation of h1>H holds between the height h1 of the elastic member 111 and the distance H from the flat portion 109d to the press-fitting start position 109e, under the condition in FIG. 6B, the laser element 107 is not in contact with the LD holder 109, and the press-fitting of the laser element 107 has not been started.

FIG. 6C is a sectional view of the LD unit 106 in a state in which the laser element 107 is in contact with the entrance of the fitting portion 109a of the LD holder 109. From this condition, press-fitting of the laser element 107 into the LD holder 109 is started by further press-fitting the laser element 107 into the LD holder 109. Under this condition, the elastic member 111 has its leading end bent outwards and being in contact with the flat portion 109d.

Owing to the abrasion between the fitting portion 109a of the LD holder 109 and the laser element 107, scraped chips are produced from the LD holder 109 or the laser element 107. However, since the clearance between the fitting portion 109a and the laser element 107 is sealed off by the elastic member 111, the scraped chips do not fall into the lens body tube 109c of the LD holder 109.

FIG. 6D is a sectional view of the LD unit 106 in a state in which press-fitting of the laser element 107 into the LD holder 109 has been completed. Here, the relation of h2<H holds between a height h2 of the elastic member 111 at the end of press-fitting of the laser element and the distance H from the flat portion 109d to the press-fitting start position 109e. Scraped chips are produced from the LD holder 109 for a while from the start until the end of press-fitting of the laser element 107. However, since the area between the laser element 107 and the LD holder 109 is always sealed off by the elastic member 111, there is no possibility of the scraped chips falling into the lens body tube 109c of the LD holder 109.

As has been described, the relation of h1>H holds between the height h1 of the elastic member 111 disposed between the laser element 107 and the LD holder 109 and mounted onto the laser element 107 and the distance H from the flat portion 109d to the press-fitting start position 109e and the relation of r1<R1 holds between the outside diameter r1 of the elastic member 111 and the inside diameter R1 of the LD holder 109. For these reasons, scraped chips produced from the LD holder 109 during press-fitting work for the laser element 107 are prevented from falling into and adhering to the lens body tube 109c and also from producing poor-quality images.

In the present exemplary embodiment, it is supposed that the relation of h1>H holds between the height h1 of the elastic member 111 and the distance H from the flat portion 109d to the press-fitting start position 109e. However, since it is required that the elastic member 111 has only to come into contact with the LD holder 109 simultaneously with the start of press-fitting of the laser element 107, the relation between h1 and the distance H may be h1≥H. If a component tolerance is taken into consideration, the relation should be h1>H.

Figure 7A:
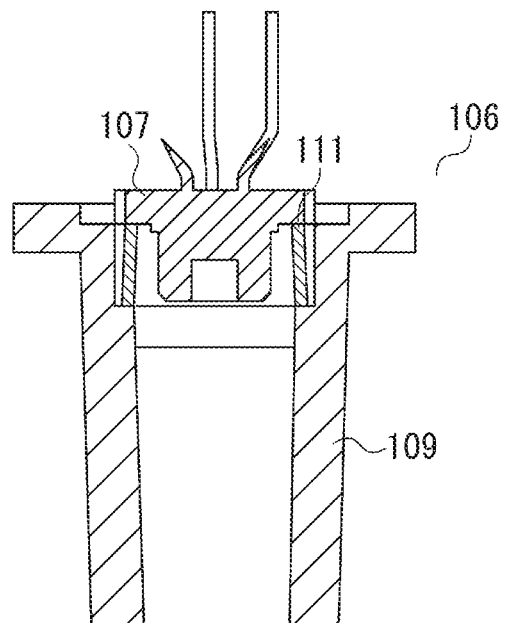
FIGS. 7A and 7B are schematic sectional views illustrating modified exemplary embodiments of the LD unit mounted in the laser beam emission apparatus according to the first exemplary embodiment.
Figure 7B:
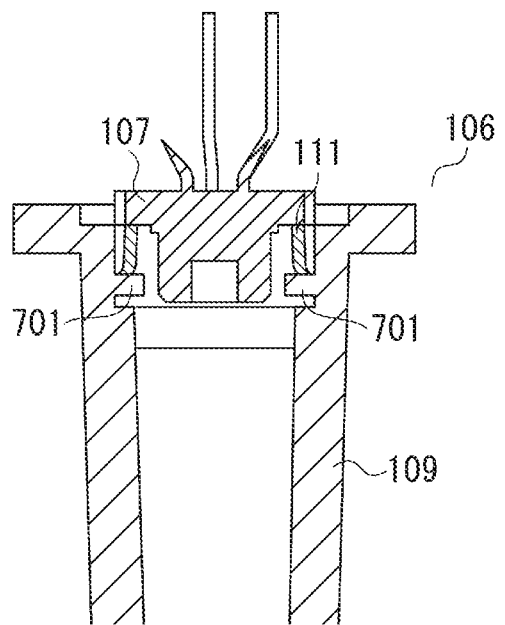

In this first exemplary embodiment, instead of the elastic member 111 with the tapered cross section, it is possible to adopt an elastic member with a bell-bottom cross section as illustrated in FIG. 7A. If the elastic member 111 is formed as illustrated in FIG. 7A, when compressed between the flat portion 109d and the laser element 107, the elastic member 111 bends outward at the bottom end, and the similar effects can be obtained. Instead of the flat portion 109d as illustrated in FIGS. 5A, 5B, 6A, 6B, 6C, and 6D, an abutting portion 701, on which the elastic member 111 abuts, may be formed inside the fitting portion 109a.

Figure 8:
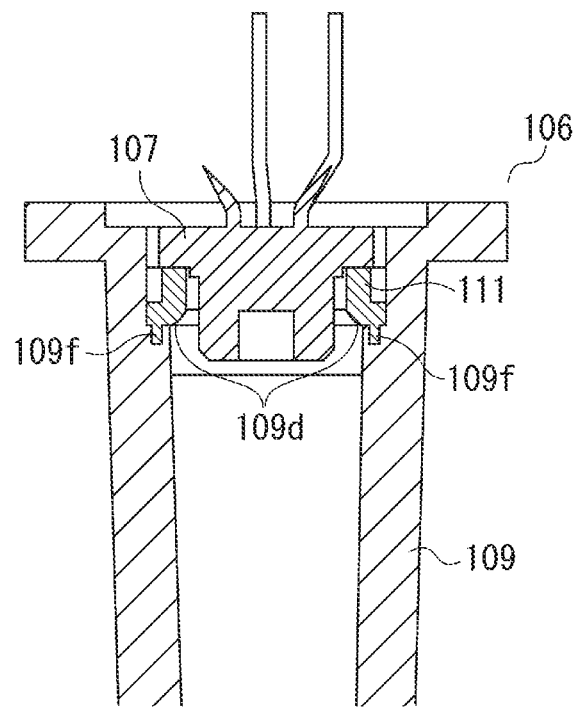
FIG. 8 is a schematic sectional view of the LD unit mounted in the laser beam emission apparatus according to the first exemplary embodiment.

In the first exemplary embodiment, the elastic member 111 is so arranged as to bend at its lower end toward the fitting portion 109a of the LD holder 109 as the press-fitting of the laser element 107 progresses. If the elastic member 111 is made of a relatively hard material, there is a possibility that the leading end of the elastic member 111 is deformed by a contact pressure of the elastic member 111. To suppress this deformation, a groove portion 109f as a relief space may be provided in the flat portion 109d as illustrated in FIG. 8.

Referring to FIGS. 9, 10A, 10B, and 10C, a secondary exemplary embodiment of the LD unit mounted in the optical scanning apparatus 100 will be described. The configuration of the optical scanning apparatus 100, the laser beam emission apparatus 101, and the housing 103 are similar to those of the first exemplary embodiment, and they are not described here.

Figure 9:
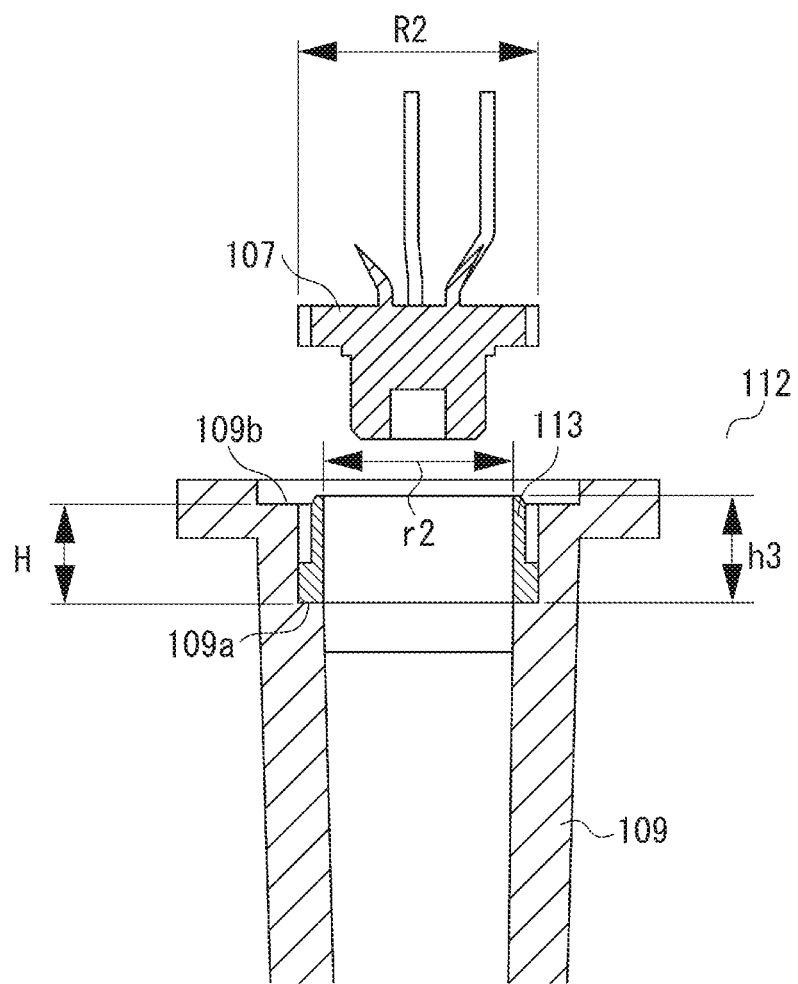
FIG. 9 is a schematic sectional view of the LD unit according to a second exemplary embodiment.

FIG. 9 is a sectional view of the LD unit 112 before the laser element 107 is press-fitted into the LD holder 109. The LD unit 112 includes the laser element 107, the LD holder 109, the collimator lens 110, and the elastic member 113. There is one thing in the second exemplary embodiment, which is different from the first exemplary embodiment, is that when the laser element 107 is inserted into the LD holder 109, the elastic member 113 has been mounted on the LD holder side. The elastic member 113 may be formed integrally with the LD holder 109 or may be formed as a separate body.

Figure 10A:
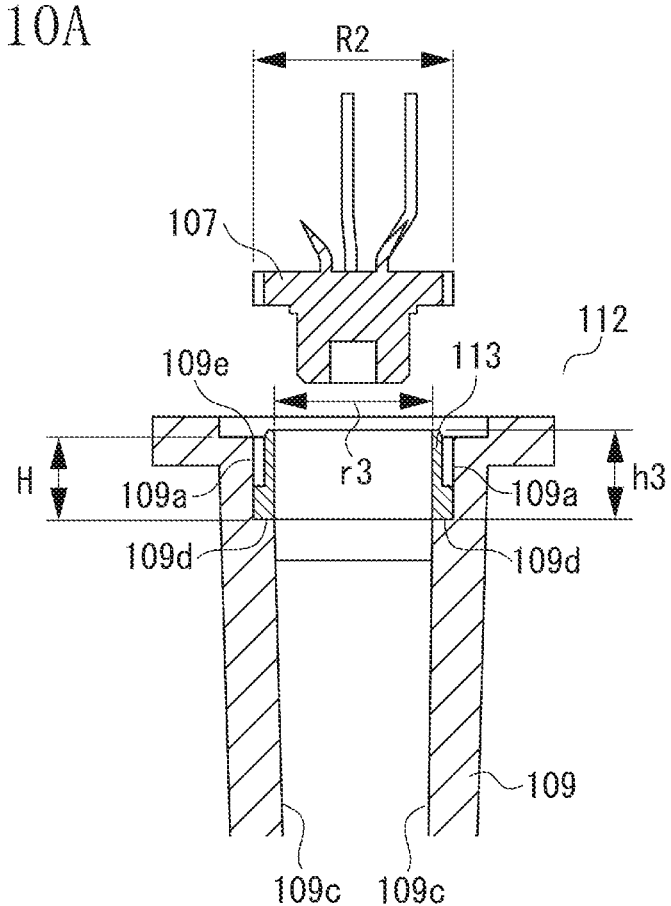
FIGS. 10A, 10B, and 10C are schematic sectional views of the LD unit illustrating a mounting procedure of the LD unit according to the second exemplary embodiment.
Figure 10B:
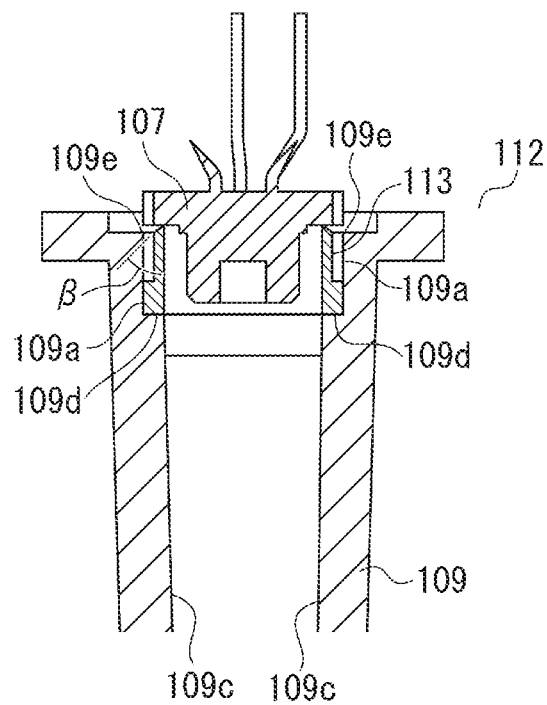
Figure 10C:
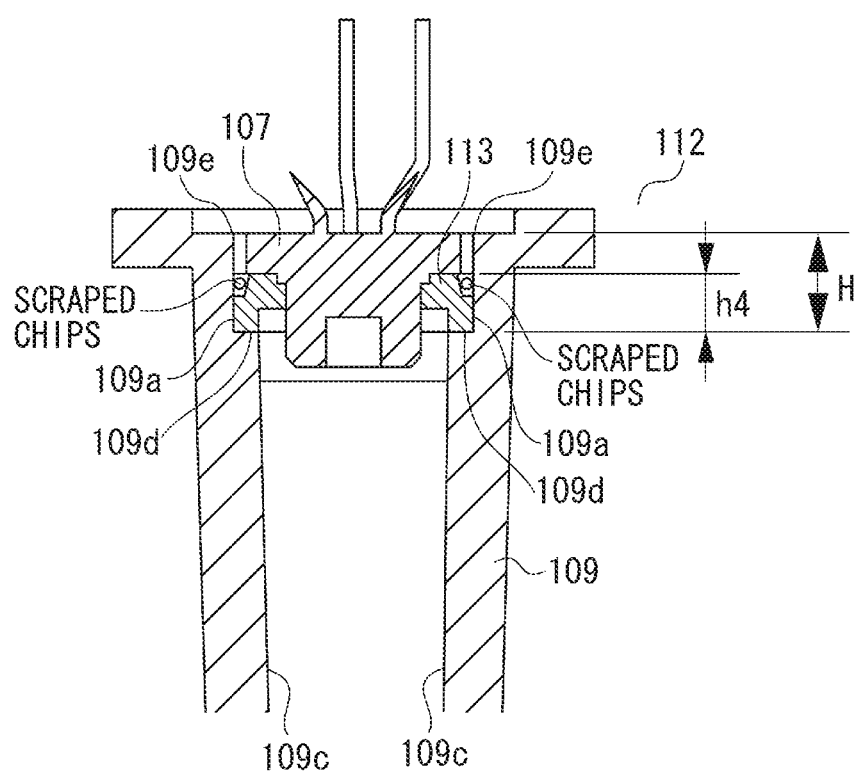
Figure 11:
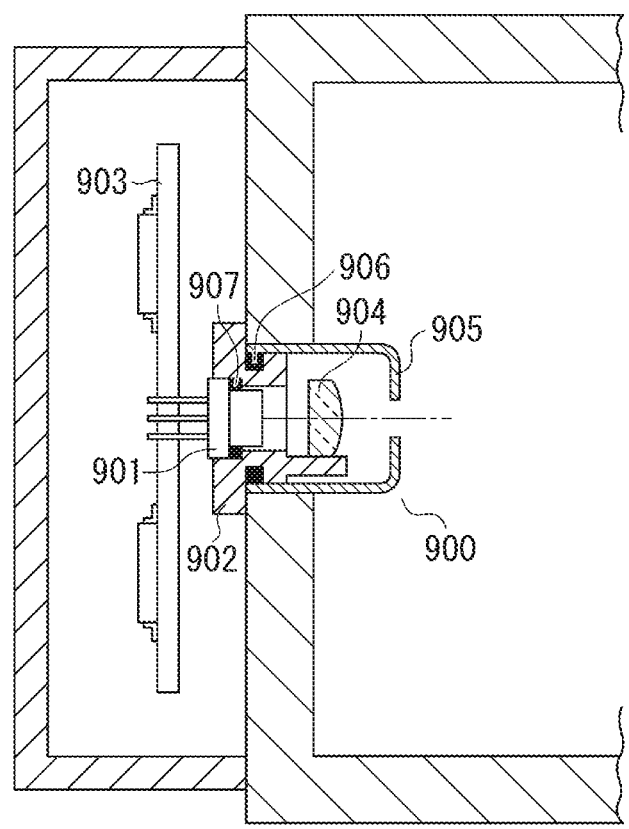
FIG. 11 is a schematic sectional view of the LD unit illustrating the dust-proof structure of a conventional optical scanning apparatus.
Figure 12A:
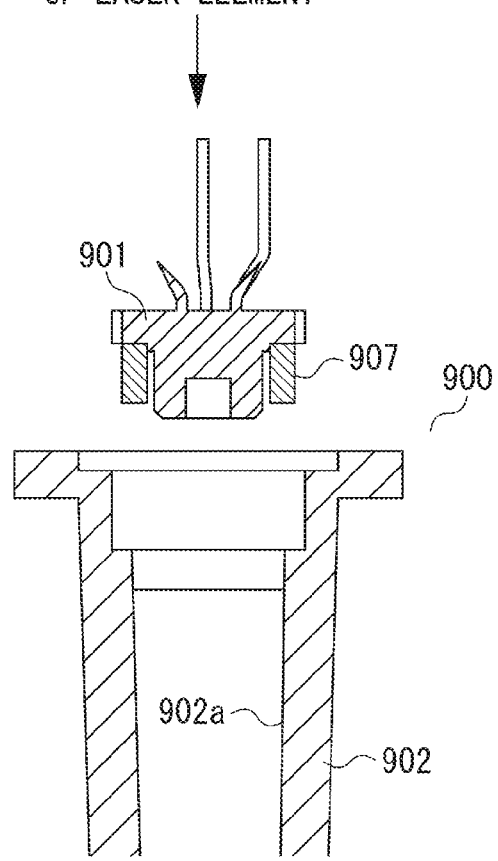
FIGS. 12A, 12B, 12C, and 12D are schematic sectional views of the LD unit illustrate a mounting procedure of the LD unit of a conventional optical scanning apparatus.
Figure 12B:
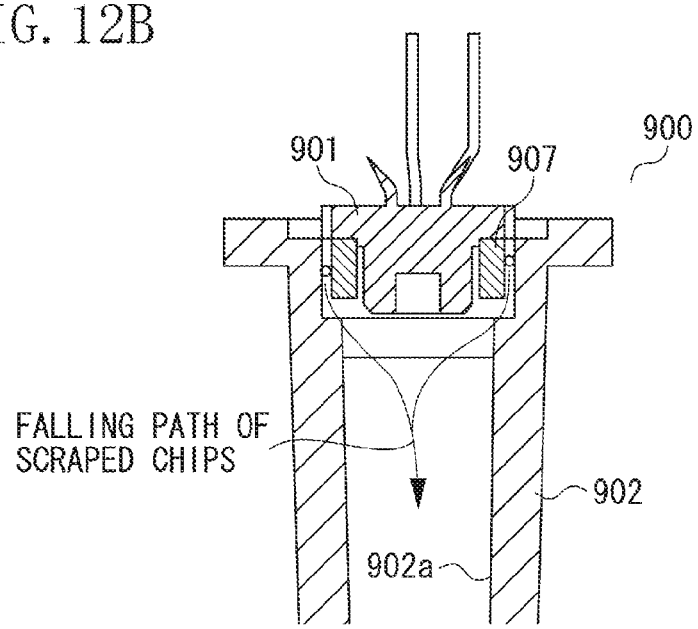
Figure 12C:
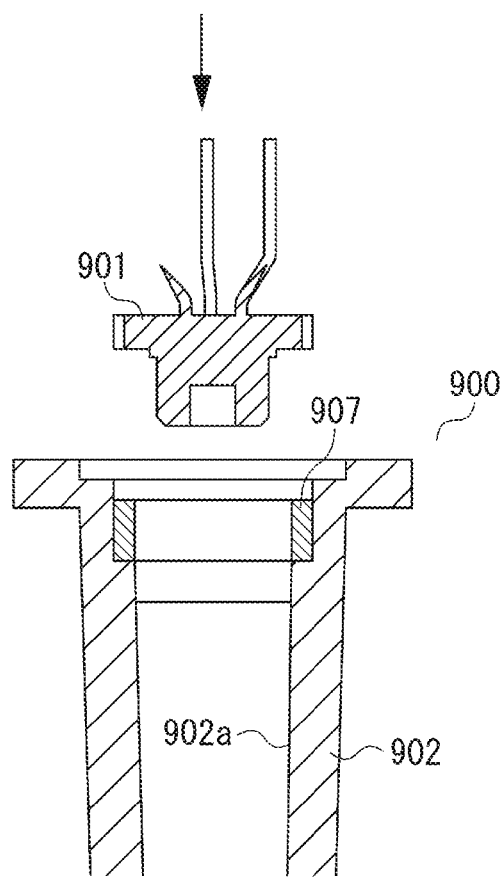
Figure 12D:
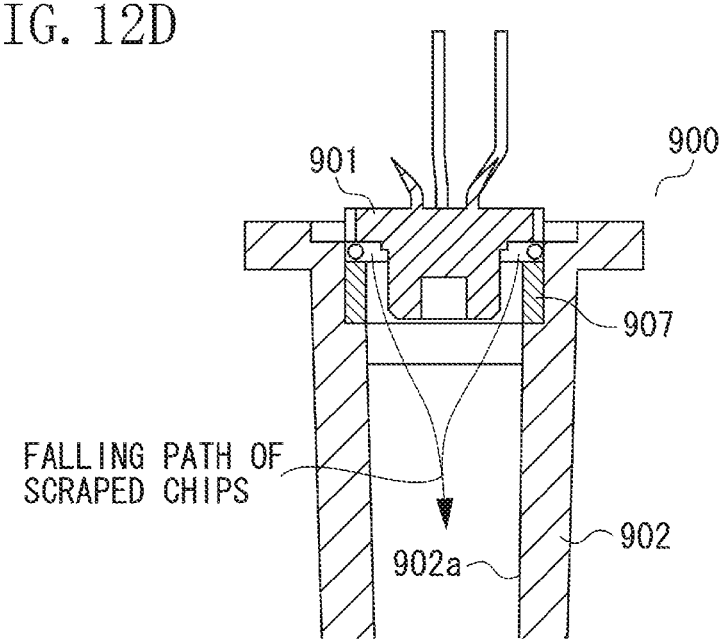

Referring to FIGS. 10A, 10B, and 10C, a press-fitting operation of the laser element 107 will be described in detail. In FIG. 10A, the elastic member 113 is mounted in the LD holder 109. Under this condition, the laser element 107 is press-fitted into the fitting portion 109a of the LD holder 109. The elastic member 113 is an annular-shaped member formed to have a height h3 longer than a distance H from the flat portion 109d to the entrance of the fitting portion 109a (h3>H). The elastic member 113 has at its leading end an inside diameter r3 smaller than an outside diameter R2 of the fitted portion of the laser element 107 (r3<R2).

FIG. 10B is a sectional view of the LD unit 112 in a state in which the laser element is in contact with the leading end of the elastic member 113 and the laser element 107 is not in contact with the entrance of the fitting portion 109a. Under this condition, the elastic member 113 blocks the clearance formed between the laser element 107 and the LD holder 109. Since the relation of h3>H holds between a height h3 of the elastic member 113 and a distance H from the flat portion 109d to the press-fitting start position 109e, the laser element 107 does not contact the LD holder 109 and press-fitting of the laser element 107 has not been started.

The leading end of the elastic member 113 is formed with an acute angle (leading-end angle β) in cross section as illustrated in FIG. 10B, namely, formed in an easy-to-deform shape. Since the leading end is processed to give an acute-angle cross section as illustrated in FIG. 10B, the leading end is moved toward the center of the laser element 107 as the press-fitting of the laser element 107 progresses. Consequently, the elastic member 113 is held between the outer circumference of the laser element 107 and the inner circumference of the LD holder 109, and there is no possibility that the press-fitting of the laser element 107 is obstructed.

FIG. 10C is a sectional view of the LD unit 112 after the press-fitting of the laser element 107 into the LD holder 109 has been completed. Here, the relation of h4<H holds between the height h4 of the elastic member 113 after completion of press-fitting of the laser element 107 and the distance from the flat portion 109d to the press-fitting start position 109e. Scraped chips are produced from the start until the end of press-fitting of the laser element 107, but because the clearance between the laser element 107 and the LD holder 109 is always sealed off by the elastic member 113, the scraped chips do not fall into the lens body tube 109c of the LD holder 109.

As has been described above, the relation of h2>H holds between the height h3 of the elastic member 113 disposed between the laser element 107 and the LD holder 109 and mounted to the LD holder 109 and the distance from the flat portion 109d to the press-fitting start position 109e, and the relation of r3<R2 holds between the outside diameter r2 at the leading end of the elastic member 113 and the inside diameter R2 of the LD holder 109. Therefore, scraped chips produced from the LD holder 109 by press-fitting work of the laser element 107 are prevented from falling into and adhering to the lens body tube 109c and also from causing poor-quality images.

In the second exemplary embodiment, it is stated that the relation of h3>H holds between the height h3 of the elastic member 113 and the distance H from the flat portion 109d to the press-fitting start position 109e. However, it is required that the elastic member 113 has only to come into contact with the LD holder 109 simultaneously with the start of press fitting of the laser element 107. Therefore, the above relation may be h3≥H. However, if a component tolerance is taken into consideration, the relation of h3>H should holds.

While the present disclosure has been described with reference to exemplary embodiments, it is to be understood that the disclosure is not limited to the disclosed exemplary embodiments. The scope of the following claims is to be accorded the broadest interpretation so as to encompass all modifications, equivalent structures, and functions.

This application claims priority from Japanese Patent Application No. 2011-138598 filed Jun. 22, 2011, which is hereby incorporated by reference herein in its entirety.

What is claimed is:

1. A light beam emission apparatus, comprising:
a light source configured to emit a light beam;
a holding member including an abutting portion and a fitting portion in which the light source is fitted; and
an elastic member configured to fill a clearance between the light source and the holding member by being elastically deformed when the elastic member contacts both the light source and the abutting portion in a state in which the light source is fitted into the fitting portion,
wherein the elastic member is elastically deformed by being compressed by the light source and the abutting portion when the light source is fitted into the fitting portion, and
wherein a length of the elastic member before being elastically deformed in an insertion direction of the light source into the fitting portion is longer than a length from an insertion port of the fitting portion for the light source to the abutting portion so that the fitting portion and a fitted portion of the light source come into contact with each other after the elastic member begins to be elastically deformed or simultaneously when the elastic member begins to be elastically deformed by contacting both the light source and the abutting portion,
wherein the abutting portion has a recessed groove to receive the elastically deformed elastic member.

2. The light beam emission apparatus according to claim 1, wherein the holding member further includes a holding portion configured to hold a lens configured to receive a light beam emitted from the light source, and a lens barrel connecting the fitting portion and the holding portion,
wherein an inside diameter of the lens barrel is less than an inside diameter of the fitting portion,
wherein the abutting portion is formed with a difference in inside diameter between the lens barrel and the fitting portion, and
wherein the elastic member is elastically deformed by being compressed by the light source and the abutting portion when the light source is fitted into the fitting portion.

3. The light beam emission apparatus according to claim 2, wherein the elastic member, which comes into contact with the abutting portion, has a acute angle in cross section at a leading end thereof.

4. An optical scanning apparatus, comprising:
the light beam emission apparatus according to claim 1; and
a rotary polygonal mirror configured to deflect a light beam, which has passed through a lens, in predetermined directions on a photosensitive member.

5. An image forming apparatus, comprising:
the optical scanning apparatus according to claim 4; and
the photosensitive member configured to be exposed by the light beam emitted from the optical scanning apparatus.

* * * * *